US009620665B1

(12) United States Patent
Bartolucci et al.

(10) Patent No.: US 9,620,665 B1
(45) Date of Patent: Apr. 11, 2017

(54) METHOD FOR IMPROVED GROWTH OF TWO-DIMENSIONAL TRANSITION METAL DICHALCOGENIDES

(71) Applicant: The United States of America as Represented by the Secretary of the Army, Washington, DC (US)

(72) Inventors: Stephen F. Bartolucci, Waterford, NY (US); Daniel B. Kaplan, Rockaway, NJ (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 0 days.

(21) Appl. No.: 15/184,008

(22) Filed: Jun. 16, 2016

Related U.S. Application Data (60) Provisional application No. 62/180,748, filed on Jun. 17, 2015.

(51) Int. Cl.
*H01L 21/02* (2006.01)
*H01L 29/786* (2006.01)
*H01L 31/18* (2006.01)
*H01L 29/66* (2006.01)

(52) U.S. Cl.
CPC ........ *H01L 31/18* (2013.01); *H01L 21/02568* (2013.01); *H01L 29/66969* (2013.01); *H01L 29/786* (2013.01)

(58) Field of Classification Search
CPC ....... C23C 16/305; C30B 25/04; C30B 29/46; C30B 25/10; G01N 27/02; G01N 33/0036; G01N 33/0027; G01N 33/0057; G01N 27/125; Y10T 29/49117; Y10T 436/174614; Y10T 436/173845; Y10T 436/17; B82Y 15/00; H01L 29/7849; H01L 29/24; H01L 29/1608; H01L 28/7781; H01L 29/267; H01L 21/02433
USPC ......... 205/638; 502/220; 428/408, 704, 523, 428/698, 457; 117/95; 438/785
See application file for complete search history.

(56) References Cited

U.S. PATENT DOCUMENTS

| | | | |
|---|---|---|---|
| 5,279,720 A | 1/1994 | Divigalpitiya | |
| 6,395,347 B1 | 5/2002 | Adachi | |
| 7,171,918 B2 | 2/2007 | Gavish | |
| 2012/0202357 A1* | 8/2012 | Sato | H01L 21/02181 438/785 |

(Continued)

OTHER PUBLICATIONS

Van Dorp, W.F. et al, "A Critical Literature Review of Focused Electron Beam Induced Deposition", Journal of Applied Physics, 2008, 1-5, vol. 104.

(Continued)

*Primary Examiner* — Thomas L Dickey
*Assistant Examiner* — Changhyun Yi
(74) *Attorney, Agent, or Firm* — Lisa H. Wang (57) ABSTRACT

Processes for controlling the growth and thickness of two-dimensional transition metal dichalcogenides are provided. The process modifies an insulator substrate surface with an electron or ion beam to create charged areas on the substrate surface. The treated surface allows for hydroxylation of the charged species which serves as nucleation sites for the seed particles during chemical vapor deposition that promotes growth of thin layers of transition metal dichalcogenides.

11 Claims, 8 Drawing Sheets

(56) References Cited

U.S. PATENT DOCUMENTS

| | | | |
|---|---|---|---|
| 2014/0037944 A1* | 2/2014 | Dichtel | B82Y 30/00 428/336 |
| 2014/0245946 A1* | 9/2014 | Kong | C30B 25/186 117/95 |
| 2014/0251204 A1 | 9/2014 | Najmaei | |

OTHER PUBLICATIONS

Shi, Yumeng, et al, "Recent Advances in Controlled Syntehsis of Two-Dimensional Transition Metal Dichalcoegnides vi Vapour Deposition Techniques", Chemical Society Review, 2015, pp. 2744-2756, vol. 44, Royal Society of Chemistry.

Ji, Qingqing, et al, "Chemical Vapour Deposition of Group-VIB Metal Dichalcogenide Monolayers: Engineered Substrates from Amorphous to Single Crystalline", Chemical Society Review, 2015, pp. 2587-2602, vol. 44, Royal Society of Chemistry.

\* cited by examiner

METHOD FOR IMPROVED GROWTH OF TWO-DIMENSIONAL TRANSITION METAL DICHALCOGENIDES

CROSS REFERENCE TO RELATED APPLICATIONS

The present application is a non-provisional application that claims the benefit of provisional application Ser. No. 62/180,748 filed on Jun. 17, 2015 the disclosure of which is incorporated in its entirety herein.

RIGHTS OF THE GOVERNMENT

The inventions described herein may be manufactured and used by or for the United States Government for government purposes without payment of any royalties.

FIELD OF INVENTION

This invention relates generally to the field of two-dimensional transition metal dichalcogenides, and more specifically to controlling the growth and thickness of these materials during synthesis.

BACKGROUND OF THE INVENTION

Two-dimensional materials, such as graphene and transition metal dichalcogenides (TMDs), are a promising class of nanomaterials for next generation electronics, photovoltaics, electrocatalysts, sensors, and optoelectronic devices. TMDs are layered materials where the bonding between layers is weak van der Waals forces, resulting in the ability to separate the layers and study the properties of individual monolayers. $MoS_2$, an exemplary TMD, is a layered semiconductor with a bandgap in the range of 1.2-1.8 eV and the physical properties of this material are thickness-dependent. For example, photoluminescense (PL) has been observed in this material as the material thickness is decreased—particularly in monolayers.

Various techniques are available for generating thin layers of $MoS_2$. For instance, chemical vapor deposition (CVD) has proven to be a powerful tool for generating large-area, high quality, monolayer molybdenum disulfide. This technique has allowed for the generation of proof-of-principle devices and sensors that take advantage of the electronic and photonic properties of transition metal dichalcogenide (TMD) monolayers. This technique however, has its drawbacks as TMDs tend to grown in random locations on the insulator surface. Ultimately, for scalable production of devices, it is critical to be able to control the location of $MoS_2$ growth in a bottom-up process directly onto a substrate of interest. This is mainly attributed to controlling nucleation of $MoS_2$ on bare $SiO_2$ substrates which has been noted as a rare and complicated process.

While strategies have been developed to enhance the location and growth of $MoS_2$ over the entire substrate, including oxygen plasma treatment, etched features to create fined scratches and the deposition of organic seed promoters, they lack the ability to provide high-resolution spatial control of the TMD growth. For example Han, G. H. et al, "Seeded growth of highly crystalling molybdenum disulphide monolayers at controlled locations" disclosed a process involving complex, multi-step lithography and delicate materials manipulation that yielded patterned flakes of $MoS_2$. This process is cumbersome and time consuming which does not lend to scale-up processes.

Likewise, Najmaei et al, U.S. Patent Publication No. 20140251204 discloses growth methods for controlled large-area fabrication of high-quality graphene analogs by patterning a surface using photolithography and electron beam deposition process. Electron beam deposition requires bombarding metal-organic gas molecules with an electron beam to dissociate and deposit the metal onto the substrate surface while photolithography uses chemicals to pattern the surface with raised "pillars." The drawback with these patterning processes is that the deposited patterns create raised "pillars" on the surface of the substrate that can limit its use in downstream device fabrication.

The invention herein addresses these deficiencies by using a simple, one-step surface modification process that allows for nucleation seeding of TMD species and production of thin layer, two-dimensional TMD at precise locations on a substrate without the use of toxic lithography chemicals.

SUMMARY OF THE INVENTION

Briefly described, the present invention generally encompasses methods for controlled growth of transition metal dichalcogenides by applying a focused ion beam or electron beam onto an insulator surface to produce a charged area on the surface. The charged surface is exposed to water molecules to hydrogenate the charged species which is then subject to chemical vapor deposition to grow thin layers of TMD.

In one embodiment the TMD is a compound having the formula, $MX_2$ wherein M is a metal selected from the group consisting of transition metals such as Mo, W and wherein X is nonmetal selected from the group consisting of S, Se and Te.

In another embodiment, a focused ion beam is applied to an insulator surface comprised of silicon dioxide. The focused ion beam may be comprised of gallium ions or other charged species such as ions and electrons.

In another embodiment, the insulator surface is selected from the group consisting of $SiO_2$, $Al_2O_3$, h-BN and phylosilicates.

In another embodiment, the charged area further comprises seed particles wherein the seed particles is at least one compound selected from the group consisting of $MoO_3$, $MoOS_2$, $MoO_2S$, $MoO_2$, $MoOS$ or mixtures thereof for the growth of the $MoS_2$ material system.

BRIEF DESCRIPTION OF THE DRAWINGS

Further features and advantages of the present invention may be understood from the drawings.

DETAILED DESCRIPTION

It has been discovered that alterations in the density of surface hydroxyl groups on silicon dioxide substrates can control nucleation and growth in molybdenum disulfide thin films produced by atmospheric-pressure chemical vapor deposition. The extent of MoS$_2$ nucleation is linearly correlated to the density of surface hydroxyl groups. Accordingly, described herein are methods for depositing thin layers of TMD at precise locations on a substrate by modification of the substrate surface with hydroxyl groups. As used herein, the term TMD refers to a metal dichalcogenide MX$_2$, wherein M represents transition metals such as Mo or W and the chalcogen, X is S, Se or Te. Specifically, the process modifies the substrate surface with an electron or ion beam to create a charge. The charged surface allows for hydroxylation of the surface atoms in the treated area which serve as nucleation sites for the seed particles that give rise to MoS$_2$ crystals. The methods described herein provides a means to pattern large-area monolayer MoS$_2$ on silicon dioxide or other insulating substrates. Such methods can be useful in applications directed to imaging, catalysis, biosensing, chemical detection, electronics and optoelectronics. As set forth herein, various embodiments of the present disclosure include one or more of the following steps of (1) modification of insulator surface using ion beam or electron beam to create a charge in the treated area, (2) hydroxylation of the species in the charged area, and (3) chemical vapor deposition of the desired TMD.

Surface Modification

Various insulator substrates surfaces may be modified to grow thin layers of TMDs. Examples of insulator substrate surfaces useful for growing TMDs include silicon oxides, aluminum oxide (Al$_2$O$_3$), hexagonal boron nitride (hBN) and phylosilicates, and preferably silicon dioxide (SiO$_2$). Insulator substrates surfaces may be exposed to ion or electron beams causing the treated area on the substrate surface to become charged. The electric charge is produced by charge trapping of electrons or ions implanted in the insulator surface. Depending on the type of beam used whether electron or ion, the charged species can be either negatively charged when exposed to an electron beam or negative or positive charged when exposed to an ion beam.

The charged species trapped in the insulator surface controls and improves later deposition of the TMD. Later growth of the TMD on the insulator surface is a function of the amount of charge that is trapped in the insulator surface, which can be controlled by the parameters used in the charge implementation process such as accelerating voltage, current, and time.

Various types, models and procedures for producing ion or electron beams are well known to those in the field. The ion or electron beams can be utilized to create predetermined shapes, lines and patterns on the substrate surface. An exemplary means by which the surface modification step can be performed include FEI helios nanolab 600i Dual-Beam FE-SEM/Ion Beam which can be used to image and create lines, shapes and patterns on SiO$_2$-based surface substrates. Application of the charge to the substrate surface is independent of any etching or milling that may also associate with the electron or ion beam application.

Hydroxylation

After the surface has been modified with charged ions or electrons, the substrate is exposed to water molecules to allow for hydroxylation of the charged species. The hydroxylated areas are the nucleation sites for seed particles that give rise to TMD crystals. Hydroxylation can be accomplished by exposure to atmospheric water vapor or other means wherein water molecules are introduced to the charged surface.

In one non-limiting example, a substrate surface comprised of silicon oxide was exposed to focused gallium ion beam operated at 30 kV at various beam currents. Ion dosage was calculated using beam current, time, and area of the pattern. Thereafter, the treated substrate surface was exposed to ambient air for several minutes or several days before chemical vapor deposition. Experimental data confirms that surface hydroxyl groups are formed upon ion beam irradiation and that the concentration can be precisely controlled by ion beam dosage.

Schematic 1 below illustrates hydroxylation of a charged substrate after surface modification. Charge transfer occurs between Ga$^{2+}$ ions and silicon atoms until the charge resides on a surface Si atom. Upon exposure to moisture in the air, the silicon cations react with water molecules to produce protonated surface hydroxyl groups.

Schematic 1: Surface Hydroxyl Generation By Ion Beam Exposure

Figure 6:
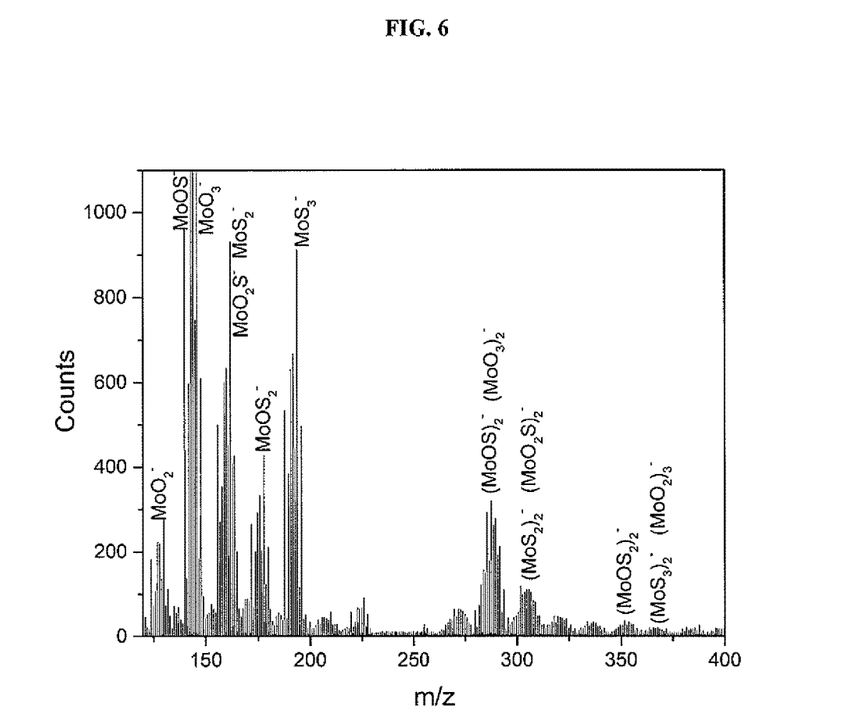
FIG. 6 is a graph of time-of-flight secondary ion mass spectrometry (TOF-SIMS) of seed particles showing seed particles having heterogenous combinations of Mo, O, and S.

The hydroxylated substrates may be used to initiate TMD growth from seed particles. In the patterned samples (FIG. 1), the region containing hydroxyl groups initiates MoS$_2$ growth from seed particles. TOF-SIMS, Auger and Raman analysis of the seed particles of the treated region reveal that these particles are of mixed chemical composition containing heterogenous combinations of Mo, O and S (FIG. 6) such as MoS$_2$, MoOS$_2$, MoO$_2$S, MoO$_2$, and MoOS with underlying multilayer MoS$_2$.

TMD Growth

Growth of thin layer TMD on the treated substrates can be accomplished using chemical vapor deposition (CVD) processes described by Najmaei et al in U.S. patent publication number 20140251204, paragraphs [0056] to [0086], and [0090] to [0093]; Shi, Y., et al "Recent Advances in Controlled Synthesis of Two-Dimensional Transition Metal Dichalcogenides Via Vapour Deposition Techniques. Chem. Soc. Rev. 44, 2744-2756 (2015); Ji, Q., et al, Chemical Vapour Deposition of Group-VIB metal Dichalcogenide Monolayers; Engineered Substrates from Amorphous to Single Crystalline, Chem. Soc. Rev. 44, 2587-2602 (2015). The contents of each is incorporated by reference herein in its entirety for the purpose of describing and disclosing chemical vapor deposition processes in connection with depositing thin layers of TMD on a substrate.

Figure 2:
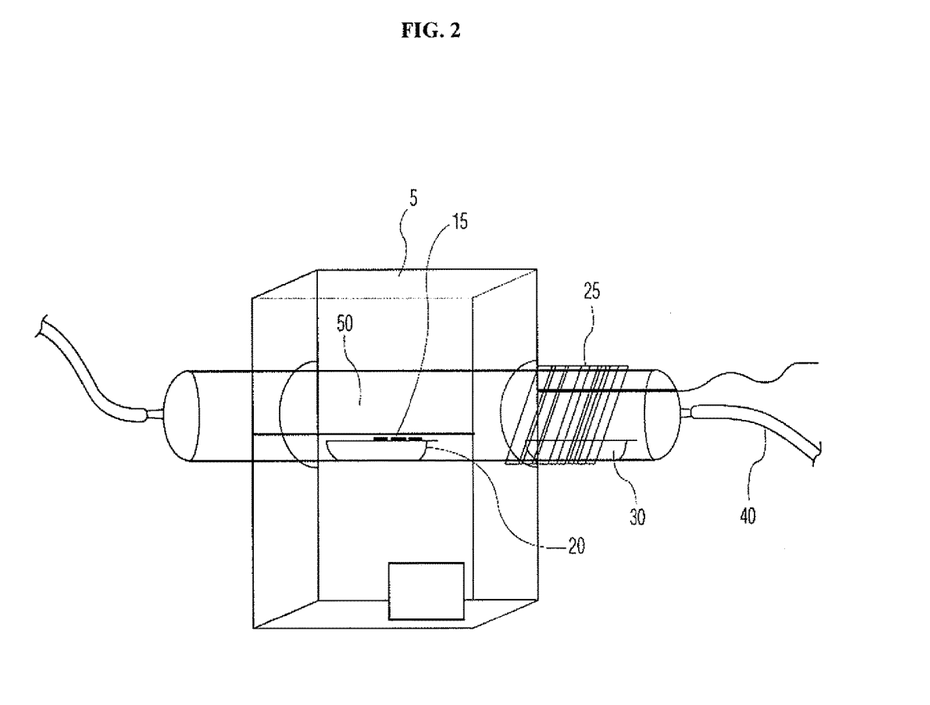
FIG. 2 is an exemplary illustration of a tube furnace.

An exemplary tube furnace 5 in FIG. 2 illustrates a chemical vapor process contemplated herein. A TMD precursor such as MoO$_3$ 20 is placed adjacent to the treated growth substrate 15 inside the tube furnace 5. The tube furnace is heated to a temperature that will allow for evaporation of the TMD. Outside the furnace, a second chemical component such as sulfur 30 is melted and evaporated by the heating element 25 and carried into the furnace by an inert gas such as argon 40. Some of the TMD precursor may be sulfurized in the atmosphere furnace tube 50 or in the vessel 20. The TMD precursor may also condense on the insulator growth substrate 15 and may be sulfurized into molybdenum oxysulfides and then eventually into molybdenum disulfide (MoS$_2$). Monolayer MoS$_2$ will collect on the areas adjacent to the hydroxylated treated areas.

Figure 1:
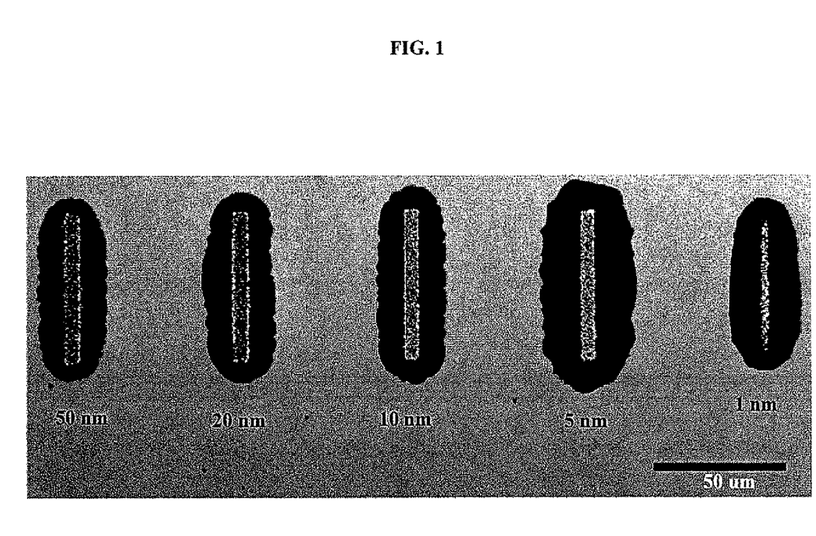
FIG. 1 are an electron microscopy images of patterned growth of $MoS_2$. The rectangular patterns were created with high gallium ion dosages which resulted in milling of the $SiO_2$ surface, with mill depths of 50, 20, 10, 5, and 1 nm, respectively (left to right). See particles were observed in the rectangular patterned region and $MoS_2$ (dark areas) surrounds the rectangular patterned region.
Figure 3:
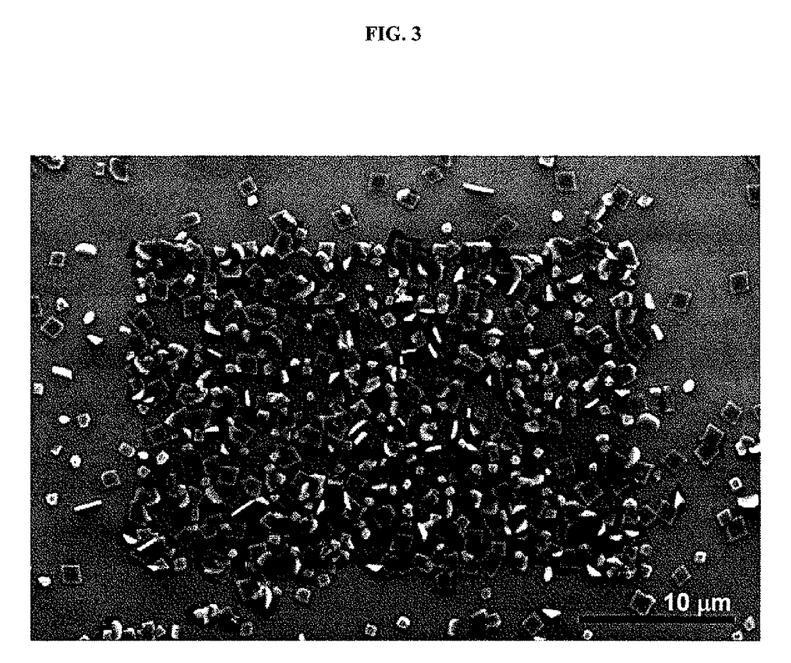
FIG. 3 is an electron microscopy image of $MoS_2$ growth in a low sulfur atmosphere.
Figure 4:
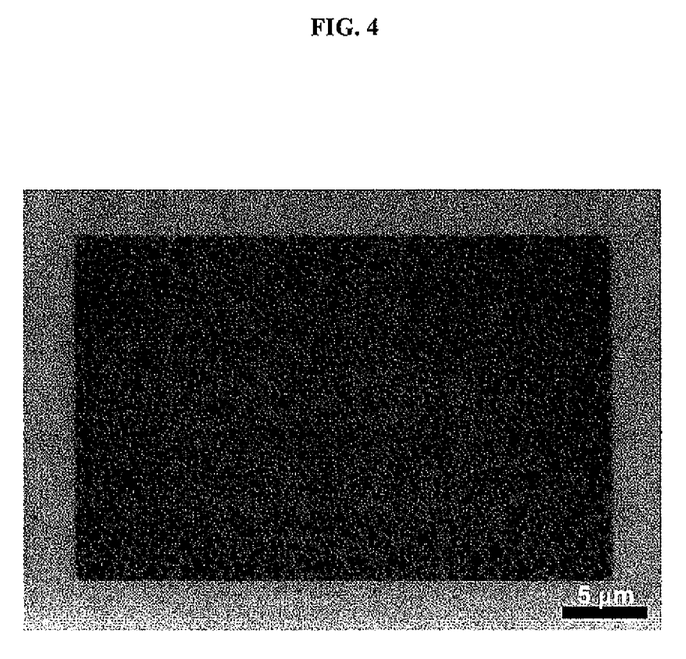
FIG. 4 is an electron microscopy image of $MoS_2$ growth in a high sulfur atmosphere.
Figure 5:
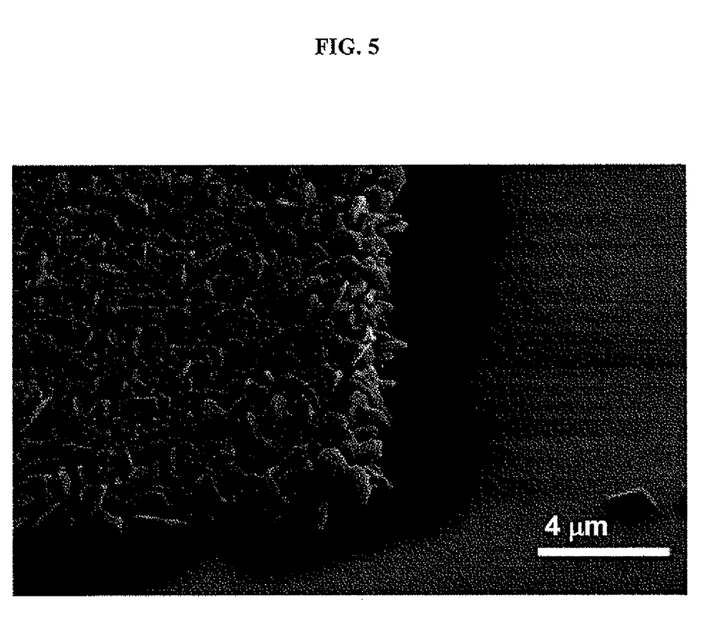
FIG. 5 is a high-resolution electron microscopy image of seed particles in a FIB patterned region. Scale bar is 4 μm.
Figure 7A:
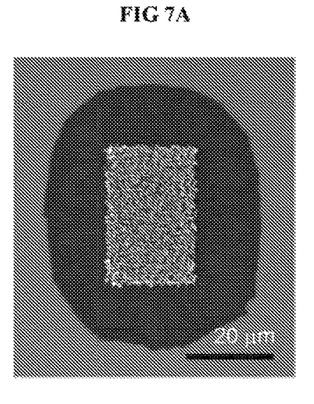
FIG. 7A is an image of the rectangular patterns created with an ion dosage of $5.0 \times 10^{15}$ ions/cm$^2$. Seed particles are observed in the rectangular patterned region with MoS$_2$ growth (dark area) surrounding the feature.
Figure 7B:
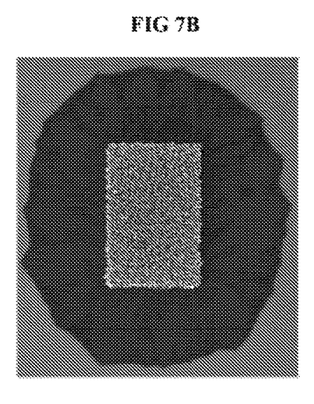
FIG. 7B is an image of the rectangular patterns created with an ion dosage of $1.44 \times 10^{16}$ ions/cm$^2$. Seed particles are observed in the rectangular patterned region with MoS$_2$ growth (dark area) surrounding the feature.

The shape, size, or thickness of the TMD film can be controlled by chamber pressure and temperature, metal source, concentration, type of surface or combinations of these factors. For example, it has been observed that monolayer MoS$_2$ growth from seed particles is a competition between sulfurization of the seed particles to form MoS$_2$ and particle growth from volatile molybdenum species. The sulfurization rate is controlled by the available concentration of sulfur and the particle growth rate is controlled by the available concentration of volatile molybdenum species. Control of the concentration of volatile molybdenum species can be achieved by the position of the substrate relative to the molybdenum powder. Conversely, the sulfur concentration is easily controlled by slight changes in the argon flow rate and/or the temperature of the sulfur powder. When the sulfur concentration is low, rapid seed particle growth occurs and little to no MoS$_2$ monolayer growth is observed in or around the patterned region (FIG. 3). At moderate sulfur concentrations, a large number of seed particles are observed in the patterned region with significant growth of MoS$_2$ emanating from the patterned seed particles as illustrated in FIGS. 1, 7A and 7B. At high sulfur concentrations, the seed particles are rapidly consumed resulting in very small MoS$_2$ monolayer crystal growth as illustrated in FIG. 4. In addition to the above factors, the magnitude of ion dosage can determine if patterned growth occurs or not.

The chemical vapor deposition process may also be performed as a single-step process as described immediately above or may be performed as separate processes, where the metal precursor evaporation step is conducted to seed the growth substrate and then a second separate sulfurization step is conducted to transform the seed particles into the TMD.

The preferred thickness of the TMD layer on the insulator surface is about 0.7 nm to 2.1 nm.

Example 1

Thermally grown silicon oxide substrates with patterns generated by ion beam and further hydroxylated underwent MoS$_2$ growth using CVD growth methods employing molybdenum trioxide (MoO$_3$) and sulfur powders. Specifically, ion beam patterns were prepared with high ion dosages, resulting in milling depths in the range of 1-50 nm, and low dosages, resulting in insignificant milling depths. As used herein the term "milling" refers to physical removal of substrate atoms from the surface that results in a measurable trench or surface depression. CVD growth was performed inside a microprocessor controlled tube furnace (Model 55053, Blue M. Lindbert) with a one inch (25.4 mm) diameter quartz tube. Outside the furnace, a portion of the tube was wrapped with heating tape. A temperature probe used for temperature control was inserted between the heating tape and the outside face of the quartz tube (Digi Trol II Glas-Col). Pieces of silicon with a 300 nm thermally grown oxide layer (University Wafer) were placed on a quartz boat facing down with 50 mg of molybdenum trioxide powder (Sigma-Aldrich>99.5%) placed at the upstream end of the boat. A second quartz boat filled with 0.5 g of sulfur powder (Acros 99.5%) was placed on the upstream side of the samples in the quartz tube under the heating tape. Argon was allowed to purge the tube for 20 minutes prior to heating. During growth argon flow was controlled to 20-50 sccm. The furnace temperature was set to 750° C. with heating rate of 25 C/min. The heating tape was not turned on until the center of the furnace has reached 300° C. and was heated to 195° C. The furnace temperature was held at 750° C. for 15 minutes and then allowed to cool slowly to room temperature. The substrate containing the thin layer MoS$_2$ film was removed and further analyzed.

Figure 7C:
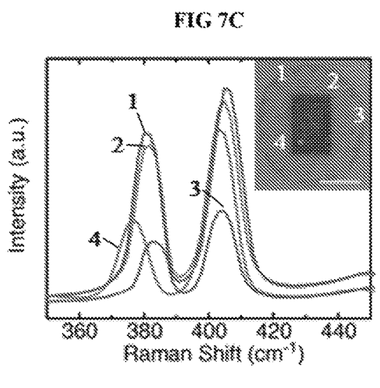
FIG. 7C is a graph illustrating the Raman spectroscopy peaks for the areas indicated in FIG. 7B.
Figure 7D:
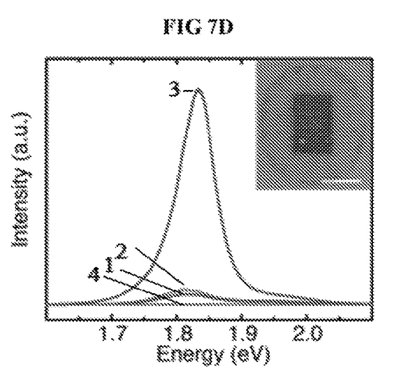
FIG. 7D is the photoluminescence peak for the sample shown in FIG. 7B.
Figure 8:
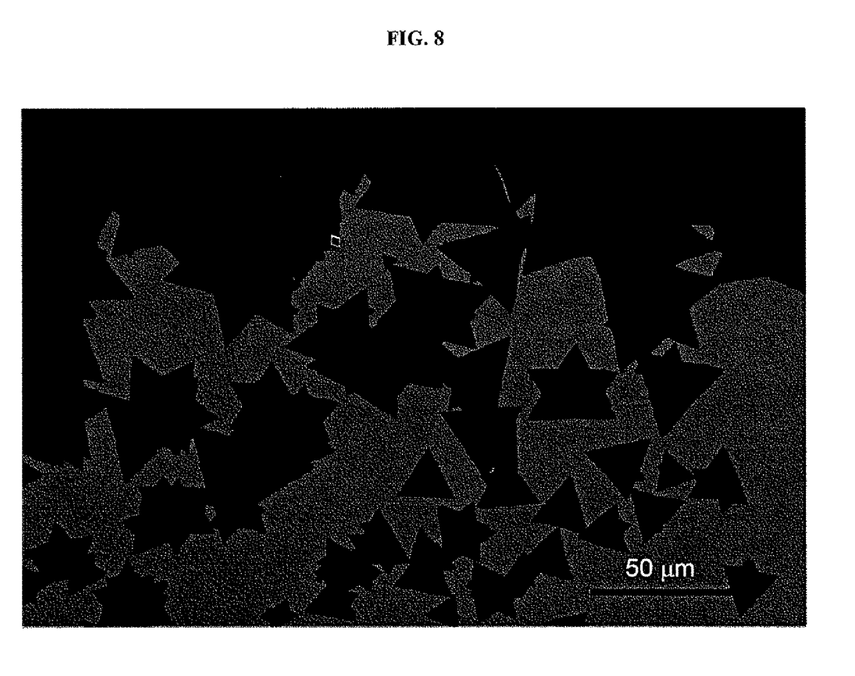
FIG. 8 is an image of showing growth of MoS$_2$ triangular crystals close to the molybdenum source.

In all cases, large-area monolayer and few-layer growth was observed emanating out from the patterned regions. When the substrates were spatially distant from the molybdenum source, growth was found predominately around the patterned regions (FIGS. 1, 7A, and 7B), with very little growth observed anywhere else on the substrate. Substrates placed closer to the molybdenum source showed typical large triangular domains (FIG. 8) all over the surface. Raman spectroscopy indicates that the patterned growth is predominately monolayer, as seen by $E_{2g}^1$ and $A_{1g}$ peak differences of 20 cm$^{-1}$ or less (FIG. 7C). Additionally, strong photoluminescence (PL) is observed from the monolayer MoS$_2$ when excited at 532 nm (FIG. 7D). In the edges and grain boundaries near the treated areas, few-layer growth occurs as shown by Raman and PL spectroscopy. In the regions directly exposed to ion beam, the MoS$_2$ growth is not monolayer, but instead, dense multi-layers of MoS$_2$ accompanied by molybdenum oxysulfides.

Example 2

In addition to a positive-charged ion beam used for patterning and enhancing growth, an electron beam (negative charge) was also used to create a charged surface. In this case, an electron beam at 20 kV from a Scanning Electron Microscope was used to pattern an area with a nominal dosage of 2.5×10$^{16}$ electrons/cm$^2$ on the silicon oxide substrate. TMD growth methods as previously described were performed to grow TMD in the electron beam patterned area.

While the invention and its embodiments have been disclosed in various forms only, it will be obvious to those skilled in the art that additions, deletions and modifications can be made without departing from the spirit and scope of this invention, and no undue limits should be imposed, except as to those set forth in the following claims.

What is claimed is:

1. A method for controlled growth of transition metal dichalcogenides (TMD) comprising
    applying an electron or focused ion beam to an insulator surface to produce a charged area;
    exposing the insulator surface to water molecules wherein the charged area comprises hydroxyl groups; and
    depositing the TMD at a thickness of about 0.7 nm to 2.1 nm on said insulator surface using a chemical vapor deposition process.

2. The method of claim 1, wherein the charged area has a defined pattern, shape or line.

3. The method of claim 1, wherein the focused ion beam comprises gallium ions.

4. The method of claim 1, wherein the insulator surface is comprised of a material selected from the group consisting of silicon oxides, $Al_2O_3$, h-BN and phylosilicates.

5. The method of claim 1, wherein the insulator surface consist essentially of $SiO_2$.

6. The method of claim 1, wherein the TMD is $MX_2$ wherein M is a metal selected from the group consisting of Mo and W and wherein X is a nonmetal selected from the group consisting of S, Se and Te.

7. The method of claim 1, wherein the TMD is $MoS_2$.

8. The method of claim 1, wherein the charged area further comprises seed particles.

9. The method of claim 8, wherein the seed particles are at least one compound selected from the group consisting of $MoO_3$, $MoOS_2$, $MoO_2S$, $MoO_2$, $MoOS$ or mixtures thereof.

10. The method of claim 1, wherein the chemical vapor deposition process occurs inside a tube furnace.

11. A method for controlled growth of transition metal dichalcogenides (TMD) comprising
    treating a substrate surface comprising $SiO_2$ with a focused ion beam to produce a charged area have a defined pattern, line or shape;
    exposing the charged area to water molecules wherein the charged area comprises hydroxyl groups; and
    depositing $MoS_2$ at a thickness of about 0.7 nm to 2.1 nm on the substrate surface by exposing said substrate surface to molybdenum trioxide and sulfur under an inert atmosphere.

* * * * *